United States Patent
Jang et al.

(10) Patent No.: US 10,305,051 B2
(45) Date of Patent: May 28, 2019

(54) FLEXIBLE DISPLAY DEVICE AND METHOD OF MANUFACTURING THE SAME

(71) Applicant: UNIVERSITY-INDUSTRY COOPERATION GROUP OF KYUNG HEE UNIVERSITY, Yongin-si, Gyeonggi-do (KR)

(72) Inventors: Jin Jang, Seoul (KR); Jae Gwang Um, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 15/741,542

(22) PCT Filed: Nov. 29, 2016

(86) PCT No.: PCT/KR2016/013896
§ 371 (c)(1),
(2) Date: Jan. 3, 2018

(87) PCT Pub. No.: WO2017/119609
PCT Pub. Date: Jul. 13, 2017

(65) Prior Publication Data
US 2018/0375042 A1     Dec. 27, 2018

(30) Foreign Application Priority Data
Jan. 4, 2016   (KR) .................. 10-2016-0000412

(51) Int. Cl.
*H01L 27/12*      (2006.01)
*H01L 27/32*      (2006.01)
(Continued)

(52) U.S. Cl.
CPC ...... *H01L 51/0097* (2013.01); *H01L 27/1225* (2013.01); *H01L 27/1262* (2013.01);
(Continued)

(58) Field of Classification Search
None
See application file for complete search history.

(56) References Cited

U.S. PATENT DOCUMENTS

| 9,748,315 B2 * | 8/2017 | Kim ................ H01L 27/3244 |
| 2003/0094615 A1 * | 5/2003 | Yamazaki ........... H01L 27/12 257/72 |

(Continued)

FOREIGN PATENT DOCUMENTS

| KR | 10-0887945 B | 3/2009 |
| KR | 10-2012-0023433 A | 3/2012 |

(Continued)

OTHER PUBLICATIONS

Tortorich, Ryan, and Jin-Woo Choi. "Inkjet Printing of Carbon Nanotubes." Nanomaterials, vol. 3, No. 3, 2013, pp. 453-468., doi:10.3390/nano3030453.*

(Continued)

*Primary Examiner* — J. E. Schoenholtz
(74) *Attorney, Agent, or Firm* — Sughrue Mion, PLLC

(57) ABSTRACT

Provided are a flexible display device and a method of manufacturing the same. More particularly, the method of manufacturing the flexible display device according to the present invention includes a step of forming a first polyimide-based layer by coating a polyimide-based solution on a carrier substrate; a step of forming an oxide thin film transistor array on the first polyimide-based layer; a step of forming a second polyimide-based layer by coating a polyimide-based solution on the oxide thin film transistor array; a step of forming an organic light emitting diode on the (Continued)

second polyimide-based layer; and a step of removing the carrier substrate, wherein, in the step of forming the oxide thin film transistor array, the oxide thin film transistor array is disposed between the first polyimide-based layer and the second polyimide-based layer.

19 Claims, 10 Drawing Sheets

(51) Int. Cl.
    *H01L 51/00*     (2006.01)
    *H01L 51/56*     (2006.01)
    *H01L 29/786*     (2006.01)

(52) U.S. Cl.
    CPC ............ *H01L 27/32* (2013.01); *H01L 27/323* (2013.01); *H01L 27/3258* (2013.01); *H01L 29/786* (2013.01); *H01L 51/00* (2013.01); *H01L 51/0048* (2013.01); *H01L 51/56* (2013.01); *H01L 2251/5338* (2013.01)

(56) References Cited

U.S. PATENT DOCUMENTS

| | | | | |
|---|---|---|---|---|
| 2008/0292856 | A1* | 11/2008 | Garner | C03C 4/00 428/220 |
| 2015/0060778 | A1* | 3/2015 | Kim | H01L 27/3258 257/40 |
| 2015/0207102 | A1* | 7/2015 | Jeong | H01L 51/5256 257/40 |
| 2016/0035761 | A1* | 2/2016 | Kwon | H01L 27/1248 257/72 |
| 2016/0035801 | A1* | 2/2016 | Kim | H01L 27/3244 257/40 |
| 2016/0064464 | A1* | 3/2016 | Namkung | H01L 27/1218 257/40 |
| 2016/0204183 | A1* | 7/2016 | Tao | H01L 51/0097 257/40 |
| 2018/0039117 | A1* | 2/2018 | Ikeda | H01L 51/5271 |

FOREIGN PATENT DOCUMENTS

| | | |
|---|---|---|
| KR | 10-1155907 B1 | 6/2012 |
| KR | 10-2013-0028267 A | 3/2013 |
| KR | 10-2015-0060015 A | 6/2015 |

OTHER PUBLICATIONS

International Search Report for PCT/KR2016/013896 dated Feb. 24, 2017.

\* cited by examiner

[Fig. 1A]
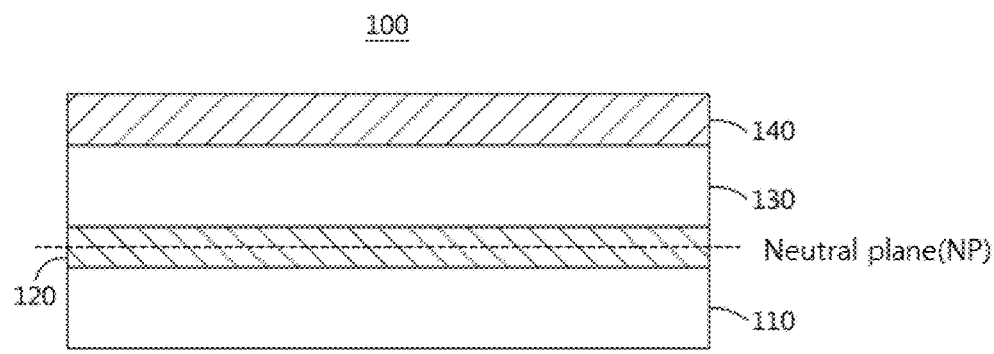
[Fig. 1B]
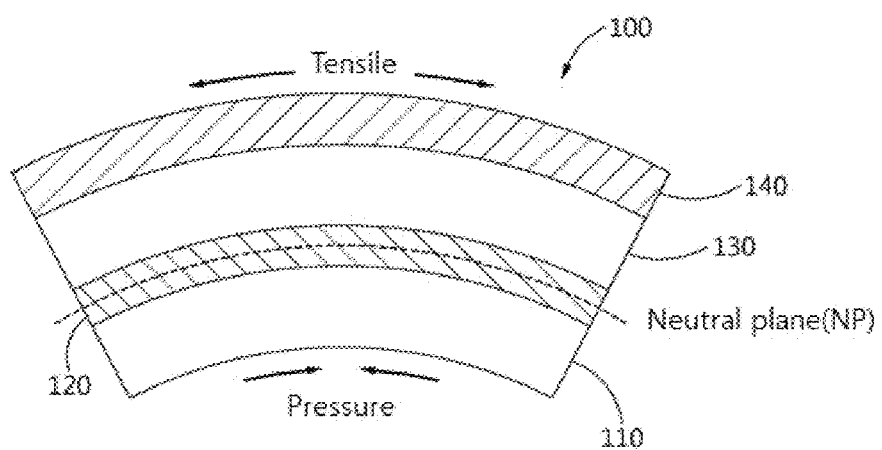

[Fig. 2]
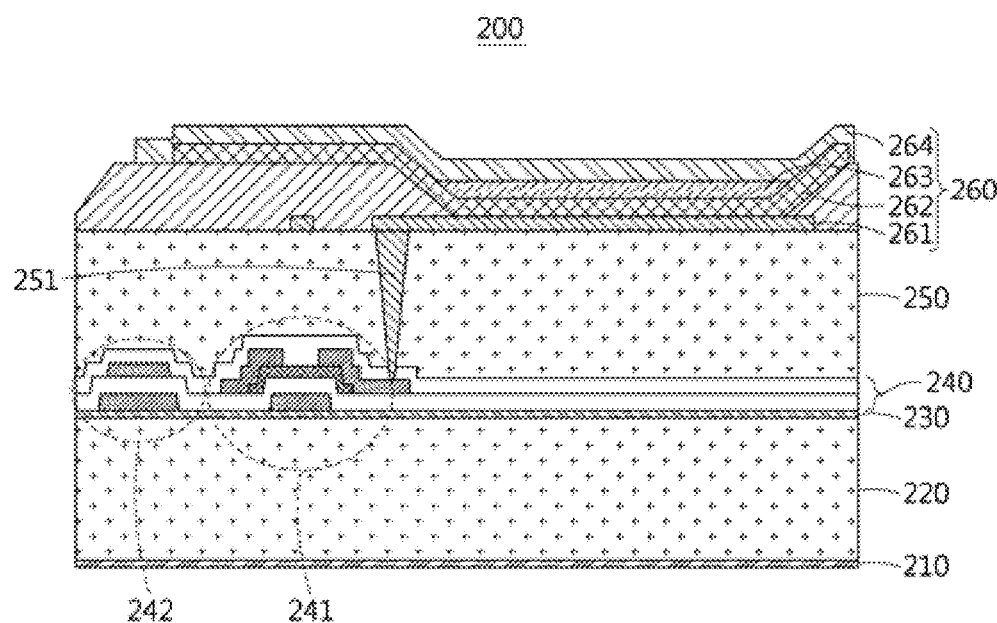
[Fig. 3A]
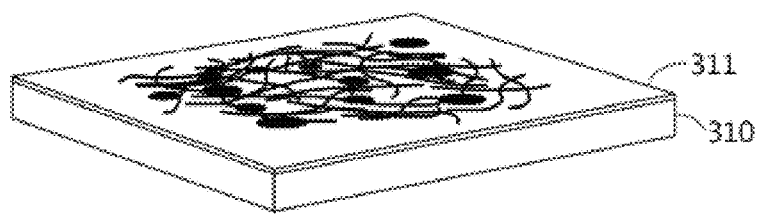
[Fig. 3B]
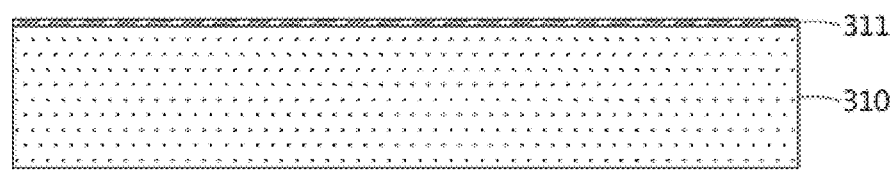

[Fig. 3C]
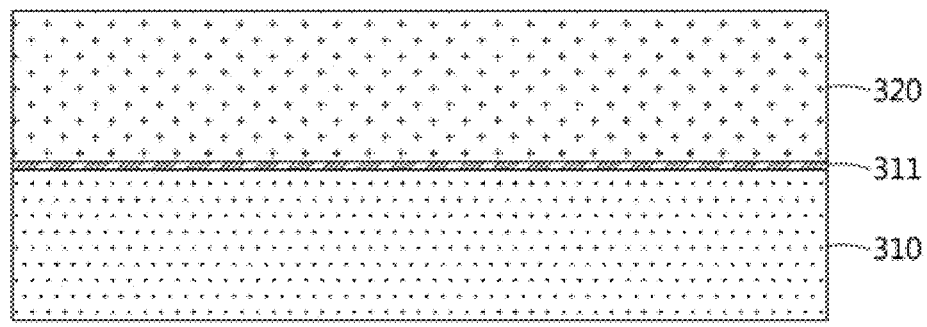
[Fig. 3D]
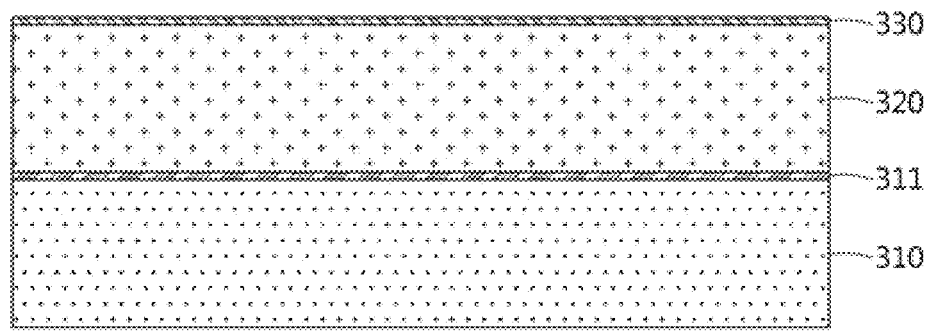
[Fig. 3E]
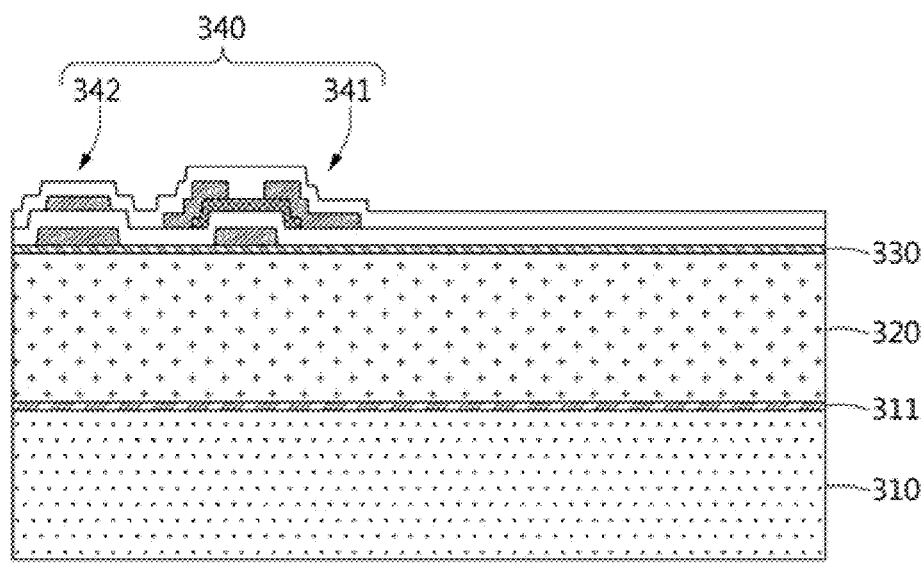

[Fig. 3F]
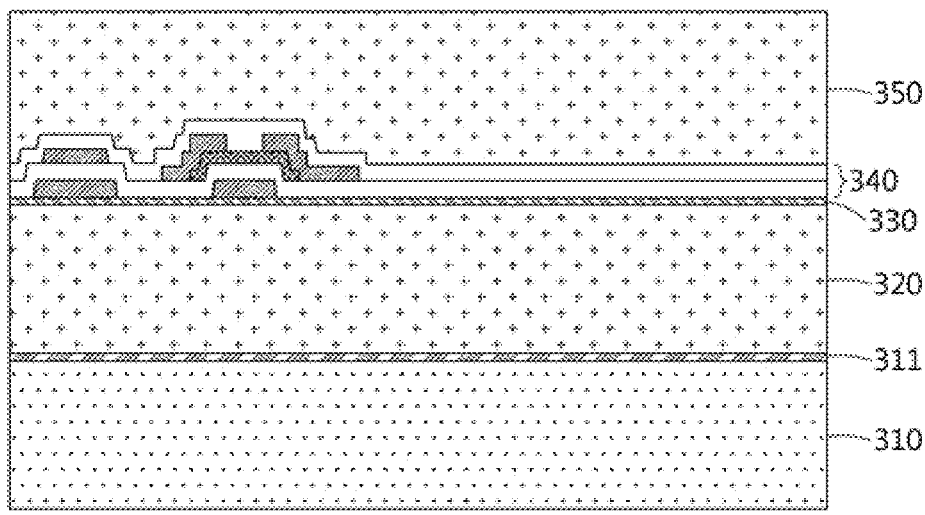
[Fig. 3G]
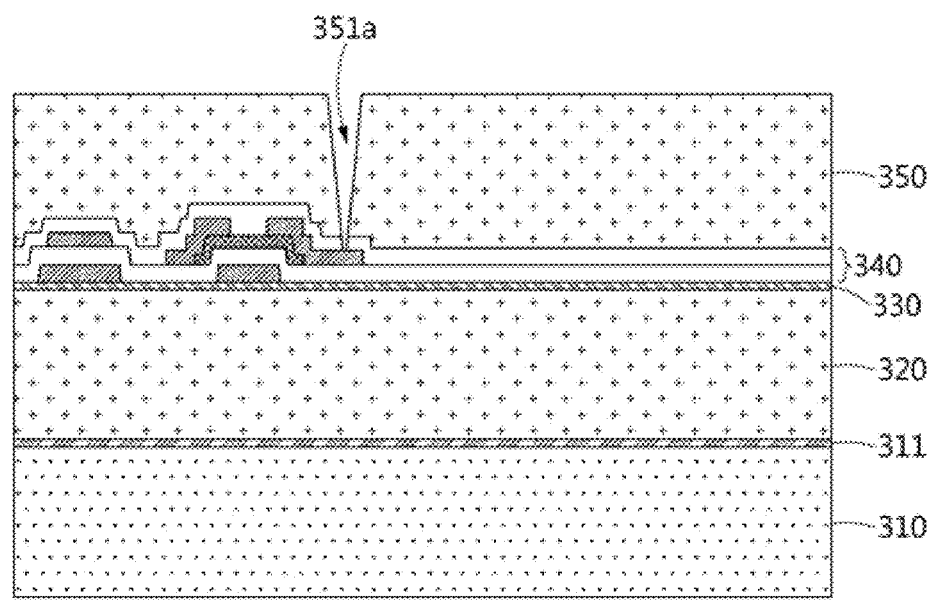

[Fig. 3H]
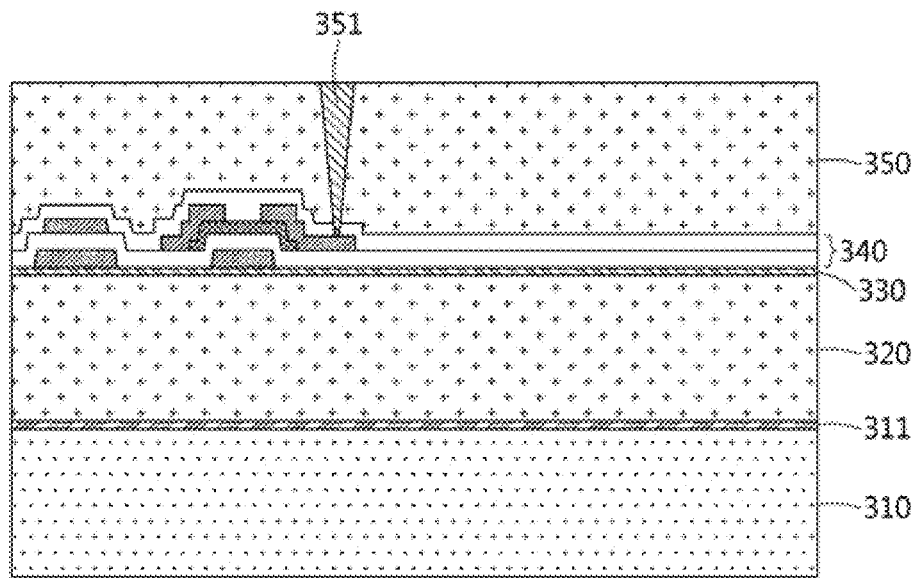
[Fig. 3I]
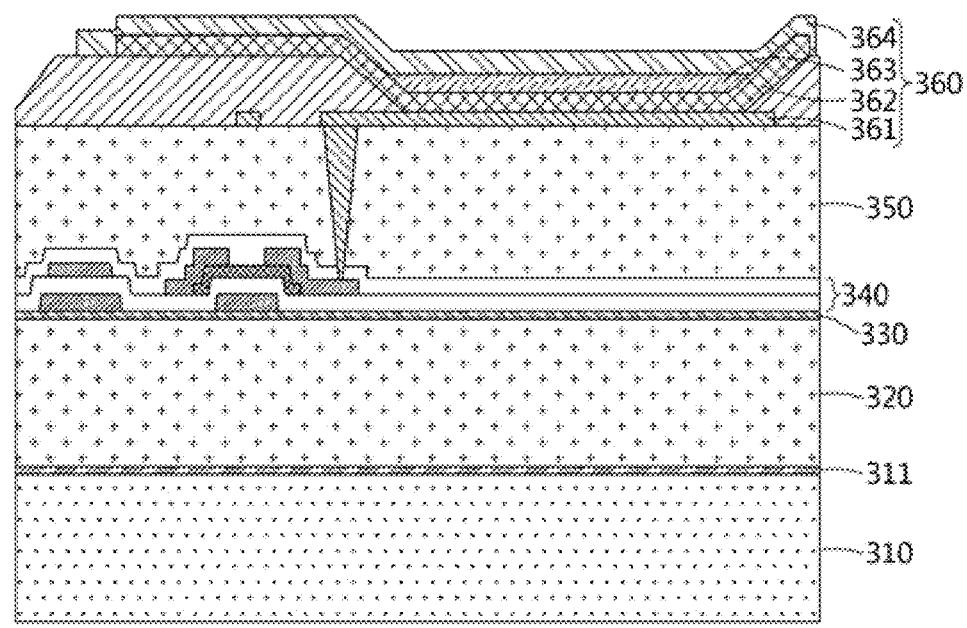

[Fig. 3J]
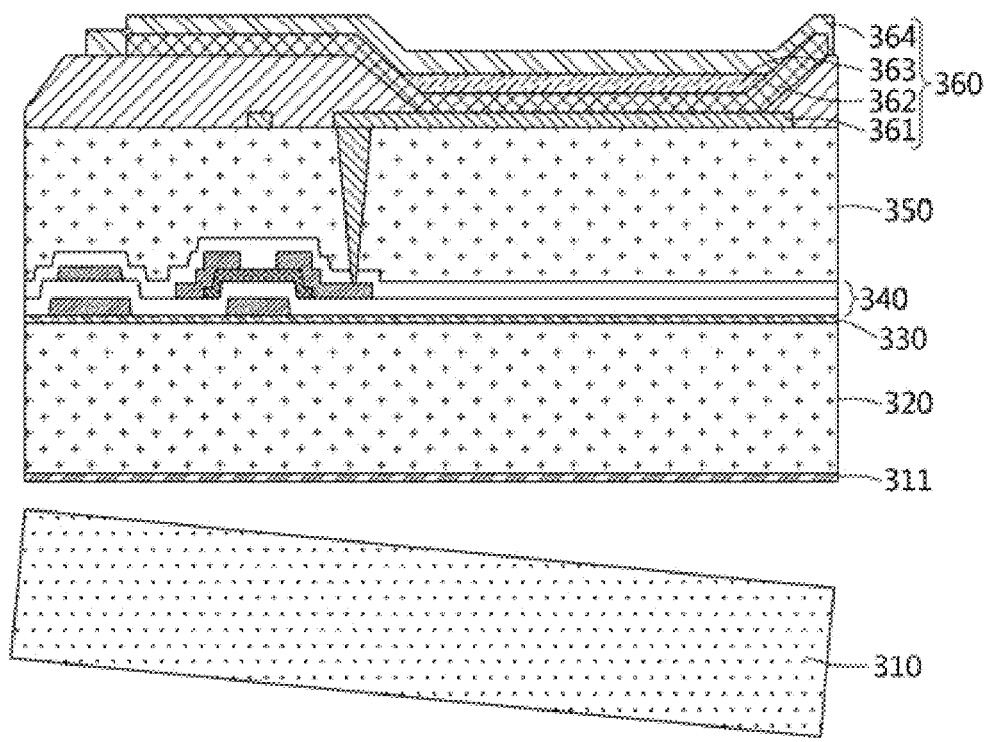
[Fig. 3K]
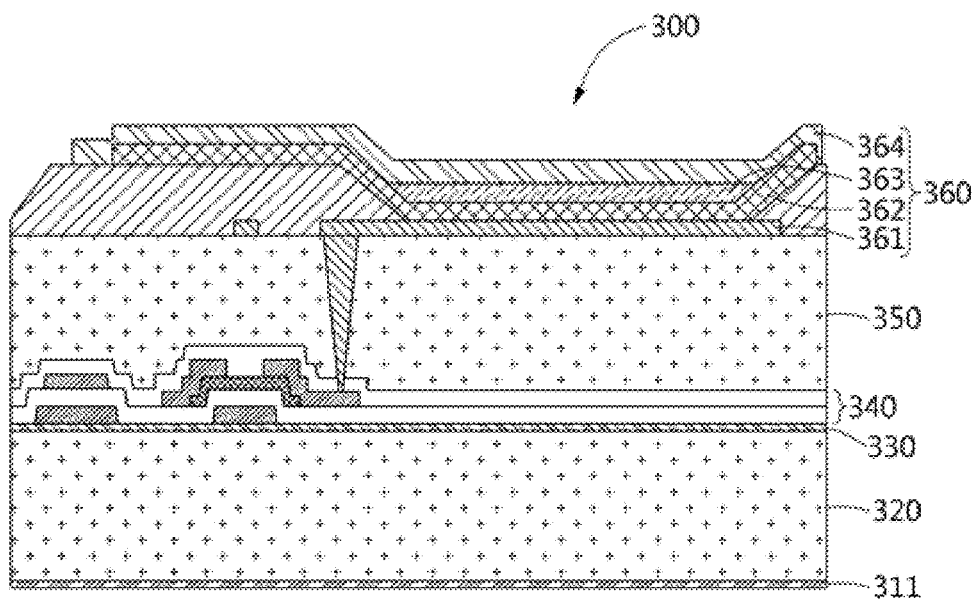

[Fig. 4A]
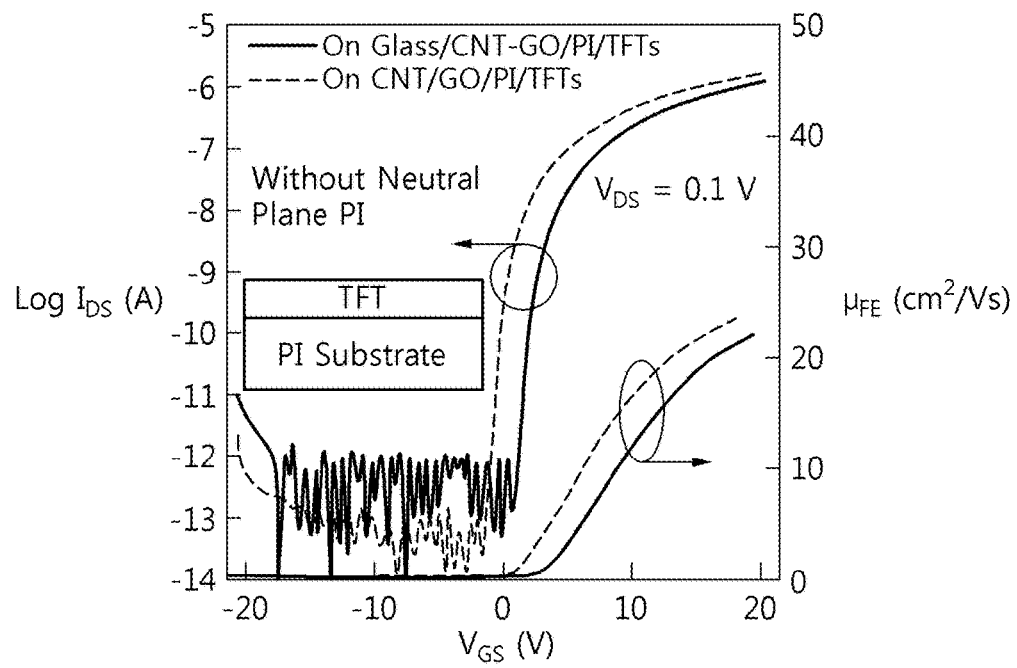
[Fig. 4B]
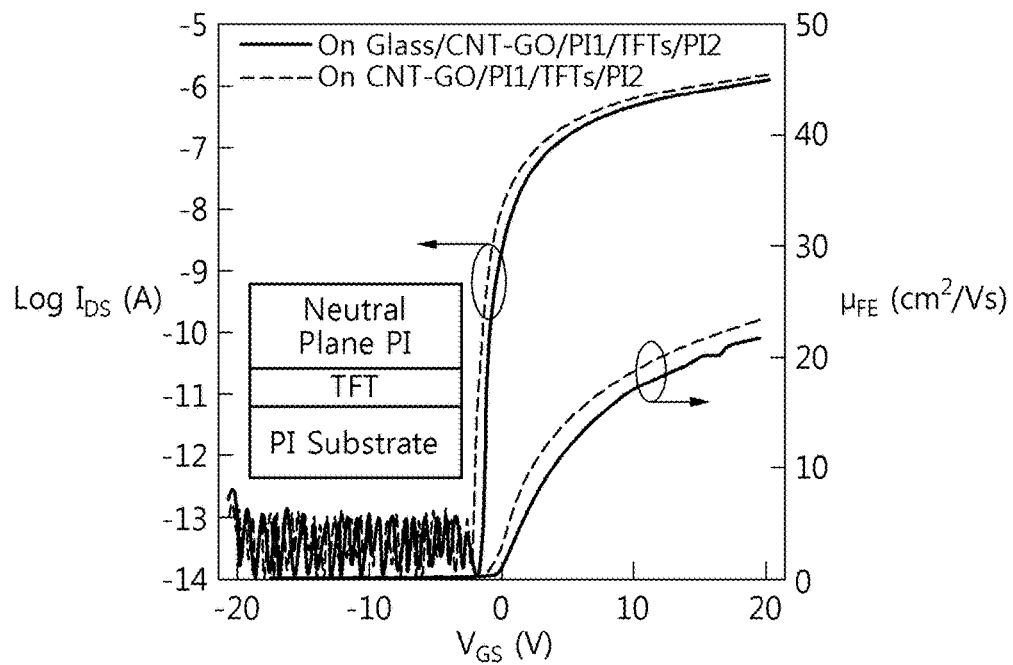

[Fig. 5A]
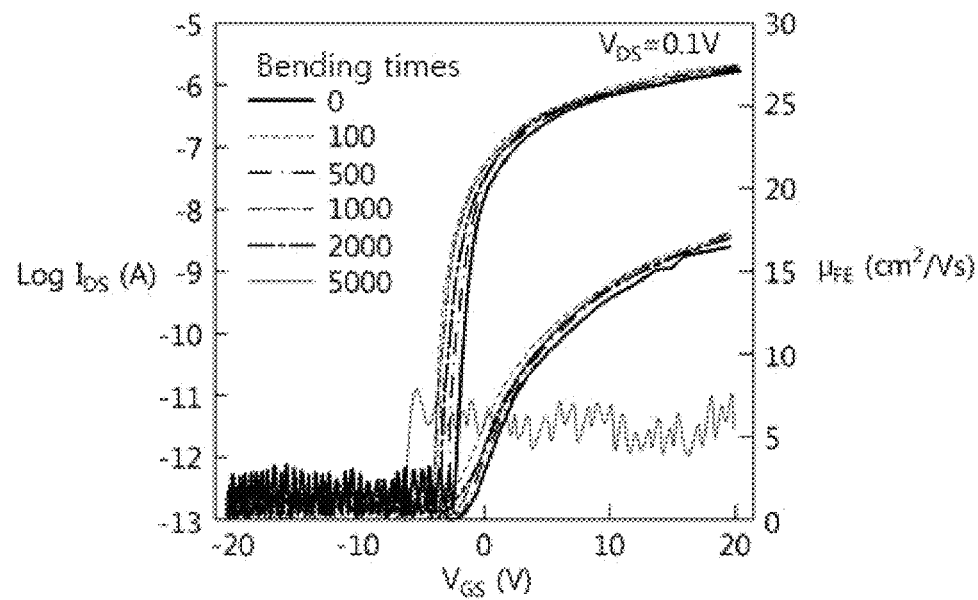
[Fig. 5B]
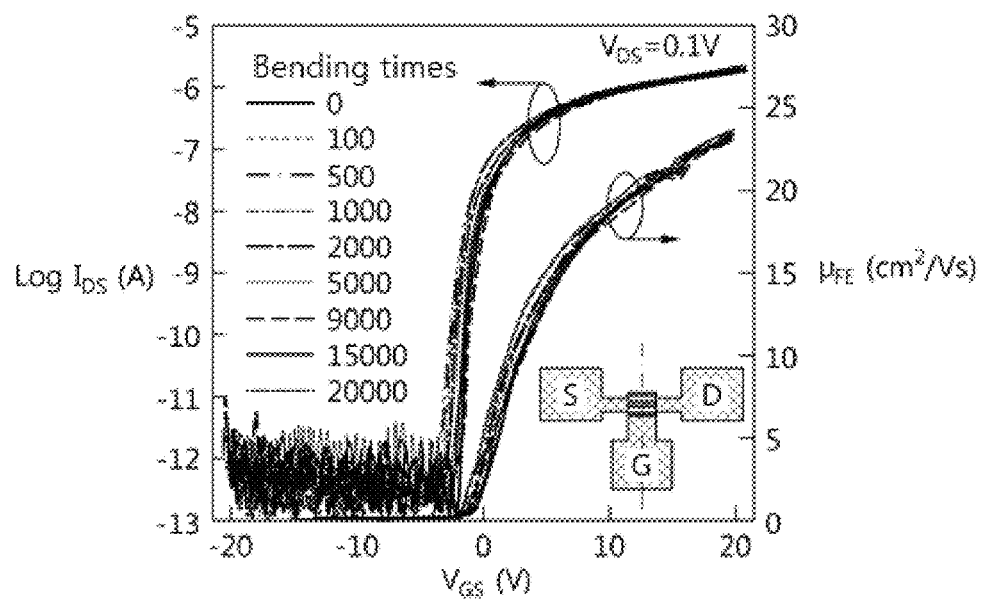

[Fig. 6A]
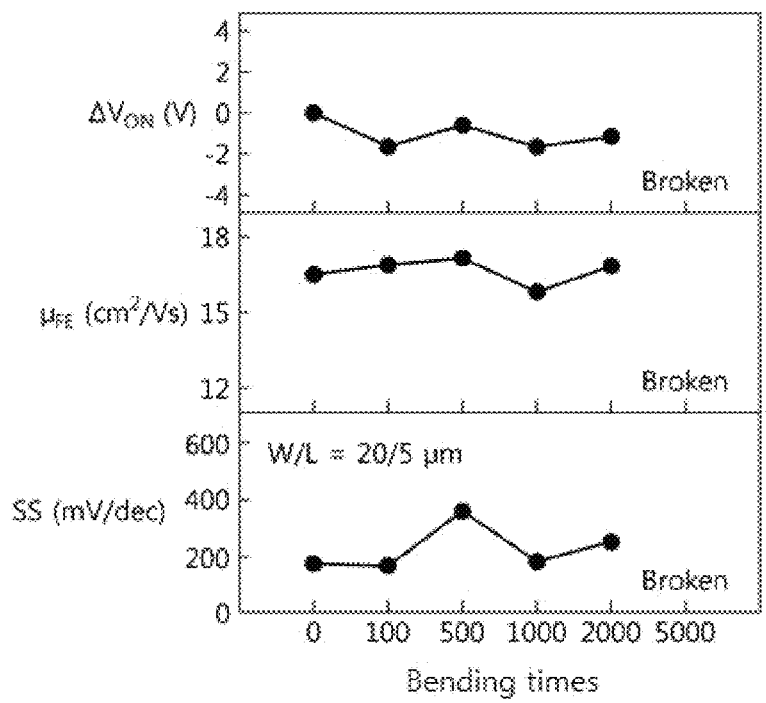
[Fig. 6B]
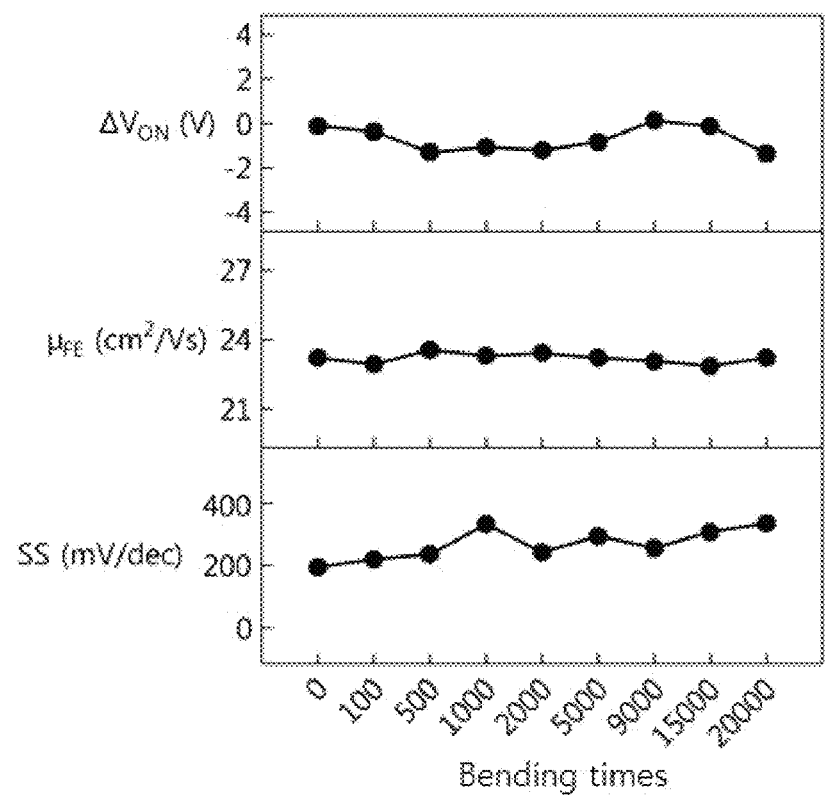

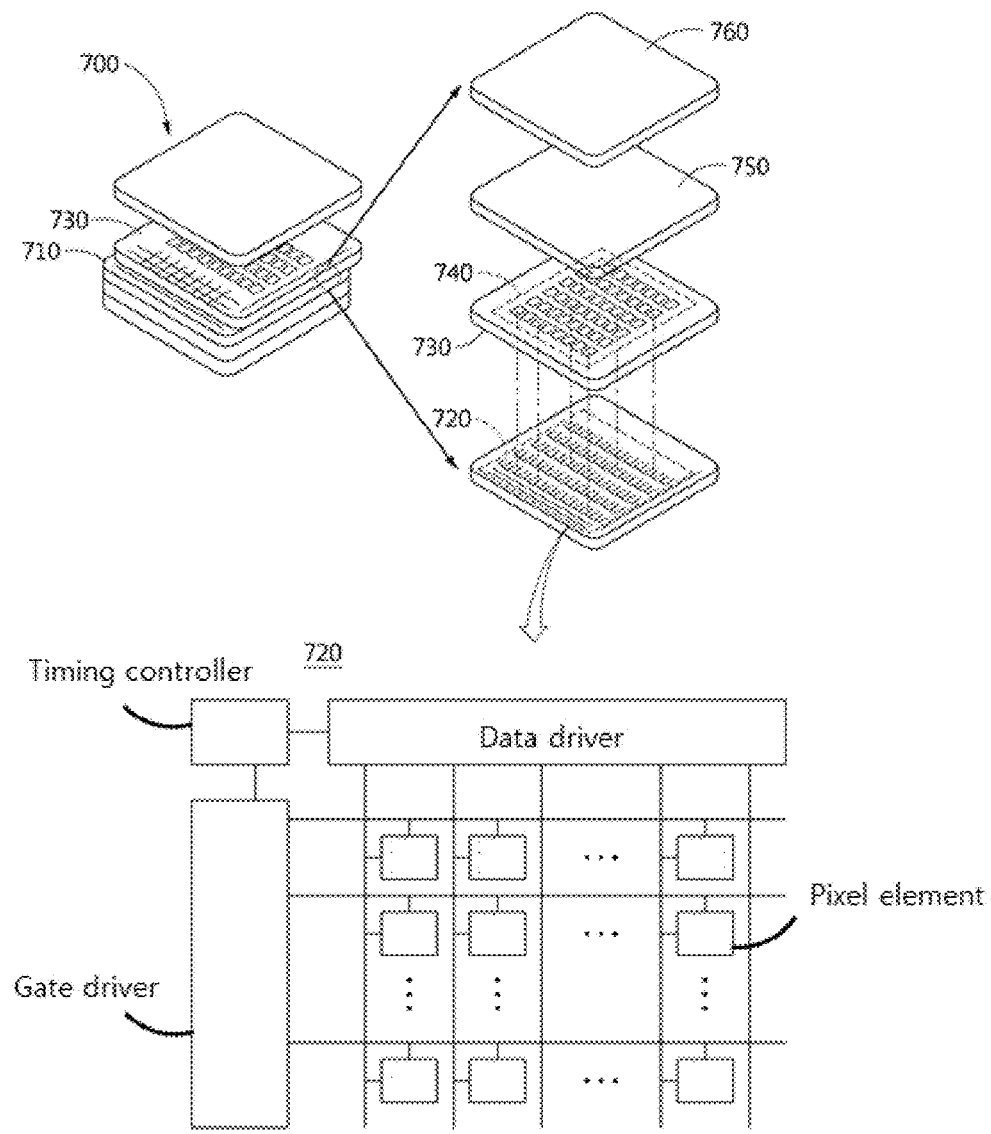
[Fig. 7]

FLEXIBLE DISPLAY DEVICE AND METHOD OF MANUFACTURING THE SAME

CROSS REFERENCE TO RELATED APPLICATIONS

This application is a National Stage of International Application No. PCT/KR2016/013896 filed Nov. 29, 2016, which claims the priority benefit of Korean Patent Application No. 10-2016-0000412, filed on Jan. 4, 2016 in the Korean Intellectual Property Office, the disclosure of which is incorporated herein by reference.

This work was supported by the Technology Innovation Program or Industrial Strategic Technology Development Program (10080454, Development of High-resolutions OLED Micro-Display and Controller SoC for AR/VR Device) funded by the Ministry of Trade, Industry & Energy (MOTIE, Korea).

TECHNICAL FIELD

The present invention relates to a flexible display device capable of providing improved lifespan and reliability by preventing damage of an oxide thin film transistor array due to external stress, and a method of manufacturing the same.

BACKGROUND ART

In general, flexible display devices, which are manufactured by forming a display on a flexible substrate to provide flexibility, are very advantageous in that they can be bent or flexed as needed. Such flexible display devices are expected to be a next-generation display device to replace portable computers, electronic newspapers, smart cards, and print media such as books, newspapers, and magazines.

Meanwhile, flexible display devices should normally maintain display performance when they are bent, but exhibit poor display performance according to bending degree.

In particular, in the case of flexible display devices, an electric device (e.g., a thin-film transistor structure) is formed on a flexible substrate. Accordingly, when a flexible display device is greatly bent, stress due to such bending is transmitted to an electric device, whereby cracks occur in the electric device or the properties of the electric device are deteriorated. These problems can become more serious when the flexible display device is excessively or repeatedly bent or the area thereof is enlarged, resulting in decrease in lifespan and reliability of the flexible display device.

RELATED ART DOCUMENTS

Patent Documents

Korean Patent No. 10-1155907 entitled "ORGANIC LIGHT EMITTING DIODE DISPLAY AND METHOD FOR MANUFACTURING THE SAME," registered on Jun. 7, 2012

Korean Patent Application Publication No. 10-2013-0028267, "LIQUID CRYSTAL DISPLAY DEVICE AND FABRICATING METHOD THEREOF," registered on Mar. 19, 2013

Korean Patent No. 10-0887945 (2009.03.03), "Liquid Crystal Display And AMOLED And Manufacturing Method Thereof," registered on Mar. 3, 2009.

DISCLOSURE

Technical Problem

Therefore, the present invention has been made in view of the above problems, and it is one object of the present invention to provide a flexible display device having improved lifespan and reliability due to inclusion of an oxide thin film transistor array disposed on a neutral plane thereof, and a method of manufacturing the same.

Technical Solution

In accordance with one aspect of the present invention, provided is a method of manufacturing a flexible display device, the method including: a step of forming a first polyimide-based layer by coating a polyimide-based solution on a carrier substrate; a step of forming an oxide thin film transistor array on the first polyimide-based layer; a step of forming a second polyimide-based layer by coating a polyimide-based solution on the oxide thin film transistor array; a step of forming an organic light emitting diode on the second polyimide-based layer; and a step of removing the carrier substrate, wherein, in the step of forming the oxide thin film transistor array, the oxide thin film transistor array is disposed between the first polyimide-based layer and the second polyimide-based layer.

In the step of forming the second polyimide-based layer, the second polyimide-based layer may be formed of a polyimide-based solution including polyimide having the same composition as the first polyimide-based layer.

The method may further include a step of forming a buffer layer by spraying an ink including carbon nanotubes onto the first polyimide-based layer The step of forming the second polyimide-based layer may include a step of penetrating the second polyimide-based layer to form a via contact for electrically connecting the oxide thin-film transistor structure to the organic light emitting diode.

The method may further include a step of forming a touch sensor on the organic light emitting diode structure In the step of forming the second polyimide-based layer, the second polyimide-based layer may be formed to the same thickness as the first polyimide-based layer.

In the step of forming the first polyimide-based layer, the first polyimide-based layer may be formed to a thickness of 50% or less based on a thickness of the second polyimide-based layer.

In the step of forming the second polyimide-based layer, the second polyimide-based layer may be formed to a thickness of 50% or less based on a thickness of the first polyimide-based layer.

In the step of forming the first polyimide-based layer and the step of forming the second polyimide-based layer, each of the first and second polyimide-based layer may formed to a thickness of 1 μm to 30 μm.

In the step of forming the first polyimide-based layer and the step of forming the second polyimide-based layer, each of the first and second polyimide-based layer may be formed to a thickness of 1 μm to 10 μm.

In the step of forming the oxide thin film transistor array, at least one an oxide thin film transistor may be formed on the first polyimide-based layer.

In accordance with another aspect of the present invention, provided is a flexible display device, including: an oxide thin-film transistor structure formed on a first flexible substrate formed of a polyimide-based material; a second polyimide-based layer formed of a polyimide-based material, formed on the oxide thin-film transistor structure; and an organic light emitting diode formed on the a second polyimide-based layer, wherein the oxide thin-film transistor structure is disposed between the first polyimide-based layer and the second polyimide-based layer.

The polyimide-based materials constituting the first polyimide-based layer and the second polyimide-based layer may be formed of a polyimide substance having the same composition.

The flexible display device may further include a buffer layer that is formed between the first polyimide-based layer and the oxide thin-film transistor structure and includes carbon nanotubes.

The second polyimide-based layer may include a via contact penetrating the second polyimide-based layer to electrically connect the oxide thin-film transistor structure to the organic light emitting diode.

The flexible display device may further include a touch sensor formed on the organic light emitting diode structure.

The first polyimide-based layer and the second polyimide-based layer may be formed to the same thickness.

The first polyimide-based layer may be formed to a thickness of 50% or less based on a thickness of the second polyimide-based layer.

The second polyimide-based layer may be formed to a thickness of 50% or less based on a thickness of the first polyimide-based layer.

Advantageous Effects

As apparent from the fore-going, a flexible display device according to the present invention includes an oxide thin film transistor array disposed between two flexible substrates to be located on a neutral plane, thereby preventing the oxide thin film transistor array from being damaged by external stress, and thus, having improved lifespan and reliability. In particular, although the flexible display device is repeatedly bent, the oxide thin film transistor array located on the neutral plane is not affected by stress.

DESCRIPTION OF DRAWINGS

FIGS. 1A and 1B illustrate a flexible display device according to an embodiment of the present invention.

FIG. 2 illustrates a flexible display device according to another embodiment of the present invention.

FIGS. 3A to 3K illustrate a manufacturing process of a flexible display device according to an embodiment of the present invention.

FIGS. 4A and 4B illustrate a current-voltage characteristic of an oxide thin film transistor included in a flexible display device of each of a comparative example and an example measured after removal of a carrier substrate.

FIGS. 5A and 5B illustrate current-voltage characteristics and field effect mobility of an oxide thin film transistor that is included in a flexible display device of each of a comparative example and an example which has been subjected to a bending test.

FIGS. 6A and 6B illustrate an electrical characteristic of an oxide thin film transistor according to each of a comparative example and an example which has been subjected to a bending test.

FIG. 7 illustrates a flexible display device provided with a touch sensor.

BEST MODE

The embodiments of the present invention are described with reference to the accompanying drawings and the description thereof but are not limited thereto.

It will be understood that when an element or a layer is referred to as being "on" another element or layer, it can be directly on the other element or layer or intervening elements or layers may be present therebetween. In contrast, when an element or a layer is referred to as being "directly on" another element or layer, there are no intervening elements or layers present.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

FIGS. 1A and 1B illustrate a flexible display device according to an embodiment of the present invention. A flexible display device 100 illustrated in FIGS. 1A and 1B includes a first polyimide-based layer 110, an oxide thin film transistor array 120, a second polyimide-based layer 130, and an organic light emitting diode 140.

In the flexible display device 100, the first and second polyimide-based layers 110 and 130 protect the oxide thin film transistor array 120 disposed therebetween.

The first and second polyimide-based layers 110 and 130 are formed of a polyimide-based material and may have the same composition. In addition, the first and second polyimide-based layers 110 and 130 may be formed to the same thickness or different thicknesses.

In accordance with the structure, the oxide thin film transistor array 120 is disposed between the first polyimide-based layer 110 and the second polyimide-based layer 130, thereby being disposed on a neutral plane (NP) at which compressive stress and tensile stress are the same.

As illustrated in FIG. 1B, when the flexible display device 100 is bent, tensile stress acts on the first polyimide-based layer 110 and compressive stress acts on the second polyimide-based layer 130. In this case, the NP is not substantially stretched or compressed, and substantial deformation does not occur. Accordingly, the oxide thin film transistor array 120 located at the NP is not deformed even when the flexible display device 100 is bent, thereby preventing decrease in electrical characteristics of the oxide thin film transistor array 120 or damage thereof.

FIG. 2 illustrates a flexible display device according to another embodiment of the present invention. A flexible display device 200 illustrated in FIG. 2 includes the first polyimide-based layer 110, the oxide thin film transistor array 120, the second polyimide-based layer 130, and the organic light emitting diode 140.

The flexible display device 200 illustrated in FIG. 2 may include a carbon nanotube-graphene oxide layer 210, a first polyimide-based layer 220, a buffer layer 230, an oxide thin film transistor array 240, a second polyimide-based layer 250, and an organic light emitting diode 260.

The carbon nanotube-graphene oxide layer (CNT-GO) 210 is a support layer having transparency. Since the carbon nanotube-graphene oxide layer 210 is bent, it is a suitable component for the flexible display device 200.

The first polyimide-based layer 220 is formed of a polyimide-based material.

The oxide thin film transistor array 240 includes at least one oxide thin film transistor 241 and transistor drive array 242. Here, the at least one oxide thin film transistor 241 may have a single gate electrode structure or a dual gate electrode structure.

The second polyimide-based layer 250 is formed of a polyimide-based material having the same composition as that of the first polyimide-based layer 220, and has the same thickness as the first polyimide-based layer 220. Here, the thicknesses of the first polyimide-based layer 220 and the second polyimide-based layer 250 may be between 1 μm and 30 μm, preferably between 1 μm and 10 μm. Accordingly, the first polyimide-based layer 220 and the second polyimide-based layer 250 may have the same elastic modulus, and a neutral plane is disposed at the oxide thin film transistor array 240 disposed between the first polyimide-based layer 220 and the second polyimide-based layer 250.

Since the oxide thin film transistor array 240 is located on a neutral plane, a length or volume of the oxide thin film transistor array 240 is not changed although the flexible display device 200 is bent, thereby not being affected by stress due to bending. In particular, since the oxide thin film transistor array 240 is not deformed although the flexible display device 200 is bent many times, problems, such as lifespan shortening or electrical reliability decrease due to crack generation on the oxide thin film transistor array 240, do not occur.

Meanwhile, the second polyimide-based layer 250 includes a via contact 251, and the via contact 251 may contact a source/drain electrode and gate electrode included in the oxide thin film transistor 241. In addition, the via contact 251 may contact a pixel electrode 261 included in the organic light emitting diode 260 formed on the second polyimide-based layer 250. That is, the via contact 251 electrically connects the oxide thin film transistor array 240 and the organic light emitting diode 260 to each other. Here, at least one organic light emitting diode 260 is formed on the second polyimide-based layer 250.

The organic light emitting diode 260 includes the pixel electrode 261, an organic light emitting layer 262 formed on the pixel electrode 261, and an opposing electrode 263 and encapsulation layer 264 formed on the organic light emitting layer 262. Here, the pixel electrode 261 contacts the via contact 251, thereby being electrically connected to the oxide thin film transistor 241.

Here, the pixel electrode 261 may be an anode and the opposing electrode 263 may be a cathode, or vice versa. When voltage is applied to the pixel electrode 261 and the opposing electrode 263, holes and electrons are injected into the organic light emitting layer 262, whereby light is emitted from the organic light emitting layer 262.

FIGS. 3A to 3J illustrate a manufacturing process of a flexible display device according to an embodiment of the present invention.

FIGS. 3A and 3B are respectively a perspective view and a sectional view illustrating a process of coating a carrier substrate 310 with carbon nanotube (CNT)-containing graphene oxide to form a carbon nanotube-graphene oxide layer 311.

The carrier substrate 310 may be formed of a porous ceramic material. Since the porous ceramic material is stable at high temperature and has high mechanical strength, it may prevent deformation of the carrier substrate 310 due to temperature and impact applied during a manufacturing process of a flexible display device.

The carbon nanotube-graphene oxide layer 311 may be formed by spin-coating a solution including carbon nanotubes dispersed therein on the carrier substrate 310, and then depositing a graphene oxide on the carbon nanotubes.

FIG. 3C illustrates a process of coating the carbon nanotube-graphene oxide layer 311 with a polyimide-based solution, as a plastic material, to form a first polyimide-based layer 320. Here, the first polyimide-based layer 320 may be formed to a first thickness.

FIG. 3D illustrates a process of forming a buffer layer 330 on the first polyimide-based layer 320. The buffer layer 330 may be formed in a manner wherein an ink including carbon nanotubes is dispersed on the first polyimide-based layer 320.

In the present invention, the buffer layer 330 may prevent external foreign substances, such as moisture or oxygen, from penetrating the first polyimide-based layer 320 and infiltrating the oxide thin film transistor array 340 to be formed on the first polyimide-based layer 320.

FIG. 3E illustrates a process of forming the oxide thin film transistor array 340 on the first polyimide-based layer 320. Here, the oxide thin film transistor array 340 may include at least one oxide thin film transistor 341 and transistor drive array 342.

Here, the at least one oxide thin film transistor 341 constituting the oxide thin film transistor array 340 may have a single gate electrode structure or a dual gate electrode structure.

In addition, an oxide semiconductor layer of the oxide thin film transistor 341 may include any one of amorphous indium-gallium-zinc oxide (a-IGZO), zinc oxide (ZnO), indium zinc oxide (IZO), indium tin oxide (ITO), zinc tin oxide (ZTO), gallium zinc oxide (GZO), hafnium indium zinc oxide (HIZO), zinc indium tin oxide (ZITO), aluminum zinc tin oxide (AZTO), and the like.

FIG. 3F illustrates a process of coating a polyimide-based solution on the oxide thin film transistor array 340 to form a second polyimide-based layer 350. The polyimide-based material constituting the second polyimide-based layer 350 may have the same composition as that of the first polyimide-based layer 320.

In addition, the second polyimide-based layer 350 may be formed to a second thickness. Here, the first thickness of the first polyimide-based layer 320 may be the same as or different from the second thickness of the second polyimide-based layer 350.

When the first thickness is different from the second thickness, a thickness of any one thereof may be determined within a range of 50% or less based on another thickness. In particular, the first polyimide-based layer 320 may be formed to a thickness of 50% or less based on the thickness of the second polyimide-based layer 350, or the second polyimide-based layer 350 may be formed to a thickness of 50% or less based on the thickness of the first polyimide-based layer 320.

Here, the first thickness or the second thickness may be determined within a range of 1 µm to 30 µm, preferably within a range of 1 µm to 10 µm. FIGS. 3G and 3H illustrate a process of forming at least one via contact 351 at the second polyimide-based layer 350. First, an area, where the via contact 351 is to be formed, of the second polyimide-based layer 350, is etched, thereby forming the via hole 351a. Although only one via hole 351a is illustrated in the drawing, the via hole 351a provided to expose a source/drain electrode and a gate electrode included in the oxide semiconductor transistor 340 may include another via hole 351a.

Subsequently, the via hole 351a is filled with a metal substance, thereby forming the via contact 351 inside the second polyimide-based layer 350. Here, the via contact 351 is provided to connect the oxide semiconductor transistor 340 to the organic light emitting diode 360 to be formed through a subsequent process.

FIG. 3I illustrates a process of forming the organic light emitting diode 360 on the second polyimide-based layer 350. The organic light emitting diode 360 may include at least one active matrix organic light-emitting diode (AMOLED) or at least one organic light-emitting diode (OLED). Hereinafter, an embodiment of the organic light emitting diode 360 including one AMOLED is described.

The organic light emitting diode 360 includes a pixel electrode 361, an organic light emitting layer 362 formed on the pixel electrode 361, and an opposing electrode 363 and encapsulation layer 364 formed on the organic light emitting layer 362. Here, the pixel electrode 361 contacts the previously formed via contact 351, thereby being electrically connected to the oxide thin film transistor 341. Accordingly, the organic light emitting diode 360 is driven according to control of the oxide thin film transistor 341, thereby emitting light.

FIG. 3J illustrates a process of removing the carrier substrate 310 from the carbon nanotube-graphene oxide layer 311. The carrier substrate 310 may be physically removed by means of a separate device.

A flexible display device 300 illustrated in FIG. 3K may be manufactured according to the aforementioned process. The flexible display device 300 has a structure wherein the oxide thin film transistor array 340 is disposed between the first polyimide-based layer 320 and the second polyimide-based layer 350 that are formed of the same substance. Here, the oxide thin film transistor array 340 is disposed on a neutral plane wherein compressive stress and tensile stress are substantially the same. Since the neutral plane is not deformed, damage to the oxide thin film transistor array 340 due to compressive stress and tensile stress may be prevented even when the flexible display device 300 is bent.

Hereinafter, FIGS. 4 to 6 are experimental data-based graphs illustrating electrical characteristics of an oxide thin film transistor included in a flexible display device according to a comparative example and an oxide thin film transistor included in a flexible display device according to an embodiment of the present invention. Here, the flexible display devices according to the comparative example and the example are as follows.

COMPARATIVE EXAMPLE

The flexible display device has a structure wherein an oxide thin film transistor array and an organic light emitting diode are sequentially formed on one flexible substrate.

EXAMPLE

The flexible display device is manufactured according to the process illustrated in FIGS. 3A to 3K and has a structure wherein an oxide thin film transistor is formed between a first polyimide-based layer and a second polyimide-based layer and an organic light emitting diode is formed on the second polyimide-based layer. Here, the oxide thin film transistor may be disposed on a neutral plane which is disposed between the first polyimide-based layer and the second polyimide-based layer and where compressive stress and tensile stress are the same.

FIGS. 4A and 4B illustrate current-voltage characteristics of an oxide thin film transistor included in a flexible display device of each of a comparative example and an example measured after removal of a carrier substrate from the flexible display device.

In FIG. 4A, two flexible display devices, lower parts of oxide thin film transistors of which were different, were used. In particular, referring to FIG. 4A, a flexible display device having a first structure wherein a flexible substrate (PI) (or a first polyimide-based layer (PI1)), a carbon nanotube-graphene oxide layer (CNT-GO), and a glass substrate (Glass) are sequentially laminated under an oxide thin film transistor (TFT), and a flexible display device having a second structure wherein a flexible substrate (PI) (or a first polyimide-based layer (PI1)), a graphene oxide (GO), and carbon nanotubes (CNT) are sequentially laminated under an oxide thin film transistor (TFT) were used.

Referring to FIG. 4A, the oxide thin film transistors according to the comparative example exhibit a log drain current of about −12 at a gate voltage at of 0 V and a log drain current of about −6 A at a gate voltage of 20 V.

Also in FIG. 4B, two flexible display devices, lower structures of oxide thin film transistors of which are different, were used. In particular, referring to FIG. 4b, a flexible display device having a first structure wherein a flexible substrate (PI) (or a first polyimide-based layer (PI1)), a carbon nanotube-graphene oxide layer (CNT-GO), and a glass substrate (Glass) are sequentially laminated under an oxide thin film transistor (TFT) and another flexible substrate (PI) (or another second polyimide-based layer (PI2)) is laminated on the oxide thin film transistor (TFT) was used. In addition, a flexible display device having a second structure wherein a flexible substrate (PI) (or a first polyimide-based layer (PI1) and a carbon nanotube-graphene oxide layer (CNT-GO) are sequentially laminated under an oxide thin film transistor (TFT) and another flexible substrate (PI) (or another second polyimide-based layer (PI2)) is laminated on the oxide thin film transistor (TFT) was used.

Referring to FIG. 4B, the oxide thin film transistors according to the example exhibit a log drain current of about −14 at a gate voltage of 0 V and a log drain current of about −6 A at a gate voltage of 20 V. Accordingly, the oxide thin film transistors according to the example have high on-off ratios, compared to the oxide thin film transistors according to the comparative example.

Meanwhile, referring to FIG. 4A, the flexible display device having the second structure according to the comparative example has superior current-voltage characteristics, compared to the flexible display device having the first structure according to the comparative example. On the other hand, referring to FIG. 4B, current-voltage characteristics of the flexible display device having the first structure according to the example are not greatly different from those of the flexible display device having the second structure according to the example. From this result, it can be confirmed that the oxide thin film transistor is not affected by the lower structure thereof due to the oxide thin film transistor disposed between the first polyimide-based layer and the second polyimide-based layer.

FIGS. 5A and 5B illustrate current-voltage characteristics and field effect mobility of the oxide thin film transistor that is included in the flexible display device of each of the comparative example and the example which has been subjected to a bending test. Here, to measure the current-voltage characteristics of the oxide thin film transistors, a bending radius was adjusted to 0.25 mm upon a bending test and bending times were accumulated.

The oxide thin film transistor according to the example has a high on-off ratio, compared to the oxide thin film transistor according to the comparative example. In particular, it can be confirmed that the current-voltage characteristics and field effect mobility of the oxide thin film transistor according to the example are improved with increasing bending times.

FIGS. 6A and 6B illustrate electrical characteristics of the oxide thin film transistor that is included in the flexible display device of each of the comparative example and the example which has been subjected to a bending test. Here, to specify on-voltage variation ($\Delta V_{ON}$), field effect mobility ($\mu_{FE}$), and subthreshold swing (SS) of the oxide thin film transistors, a bending radius was adjusted to 0.25 mm upon a bending test and bending times were accumulated.

In the case of the oxide thin film transistor according to the comparative example, on-voltage variation ($\Delta V_{ON}$), field effect mobility ($\mu_{FE}$), and subthreshold swing (SS) were greatly changed as bending times were accumulated. In particular, the flexible display device was damage when bending was performed 5,000 times. This result occurs because stress due to repeated bending of the flexible display device is transmitted to the oxide thin film transistor, and thus, cracks are generated on the oxide thin film transistor.

On the other hand, the on-voltage variation ($\Delta V_{ON}$), field effect mobility ($\mu_{FE}$), and subthreshold swing (SS) of the oxide thin film transistor according to the example are not greatly changed although bending times are accumulated. In particular, the flexible display device was not damaged even when bending was performed 20,000 times. This result occurs because the oxide thin film transistor included in the flexible display device according to the example is located on a neutral plane, and thus, deformation due to bending is prevented.

FIG. 7 illustrates a flexible display device provided with a touch sensor.

A flexible display device 700 illustrated in FIG. 7 includes a first polyimide-based layer 710, an oxide thin film transistor array 720, a second polyimide-based layer 730, an AMOLED array 740, an encapsulation layer 750, and a touch sensor 760. That is, the flexible display device 700 may include a touch sensor 760, thereby being provided in a touch type.

The oxide thin film transistor array 720 includes a plurality of oxide thin film transistors and transistor driving circuits. The oxide thin film transistors may function as pixel elements and may be connected to the transistor driving circuits. In addition, the transistor driving circuits may include components such as a gate driver, a data driver, and a timing controller.

Referring to FIG. 7, since the oxide thin film transistor array 720 is located on a neutral plane, the oxide thin film transistors and the transistor driving circuits are prevented from being damaged due to external stress. Accordingly, a bezel (an edge of the flexible display device 700) for protecting transistor driving circuits which is located at an outer portion of the oxide thin film transistor array 720 is not necessary, thereby omitting a bezel installation process and thus reducing cost.

Although exemplary embodiments of the present invention have been disclosed for illustrative purposes, those skilled in the art will appreciate that various modifications, additions and substitutions are possible, without departing from the scope and spirit of the invention as disclosed in the accompanying claims. For example, proper result may be achieved even if the techniques described above are implemented in an order different from that for the disclosed method, and/or disclosed constituents such as a system, structure, device and circuit are coupled to or combined with each other in a form different from that for the disclosed method or replaced by other constituents or equivalents.

It should be understood, however, that there is no intent to limit the invention to the embodiments disclosed, rather, the invention is to cover all modifications, equivalents, and alternatives falling within the spirit and scope of the invention as defined by the claims.

DESCRIPTION OF SYMBOLS

100: Flexible display device
110: First polyimide-based layer
120: Oxide thin film transistor array
130: Second polyimide-based layer
140: Organic light emitting diode

The invention claimed is:
1. A method of manufacturing a flexible display device, the method comprising:
   a step of forming a first polyimide-based layer by coating a polyimide-based solution on a carrier substrate;
   a step of forming an oxide thin film transistor array on the first polyimide-based layer;
   a step of forming a second polyimide-based layer by coating a polyimide-based solution on the oxide thin film transistor array;
   a step of forming an organic light emitting diode on the second polyimide-based layer; and
   a step of removing the carrier substrate, wherein the first polyimide-based layer and the second polyimide-based layer have a same elastic modulus with each other, and wherein in the step of forming the oxide thin film transistor array, the oxide thin film transistor array is disposed between the first polyimide-based layer and the second polyimide-based layer.

2. The method according to claim 1, wherein, in the step of forming the second polyimide-based layer, the second polyimide-based layer is formed of a polyimide-based solution comprising polyimide having a same composition as the first polyimide-based layer.

3. The method according to claim 1, further comprising a step of forming a buffer layer by spraying an ink comprising carbon nanotubes onto the first polyimide-based layer.

4. The method according to claim 1, wherein the step of forming the second polyimide-based layer comprises a step of penetrating the second polyimide-based layer to form a via contact for electrically connecting the oxide thin film transistor array to the organic light emitting diode.

5. The method according to claim 1, further comprising a step of forming a touch sensor on the organic light emitting diode.

6. The method according to claim 1, wherein, in the step of forming the second polyimide-based layer, the second polyimide-based layer is formed to a same thickness as the first polyimide-based layer.

7. The method according to claim 1, wherein, in the step of forming the first polyimide-based layer, the first polyimide-based layer is formed to a thickness of 50% or less based on a thickness of the second polyimide-based layer.

8. The method according to claim 1, wherein, in the step of forming the second polyimide-based layer, the second polyimide-based layer is formed to a thickness of 50% or less based on a thickness of the first polyimide-based layer.

9. The method according to claim 6, wherein, in the step of forming the first polyimide-based layer and the step of forming the second polyimide-based layer, each of the first and second polyimide-based layers is formed to a thickness of 1 μm to 30 μm.

10. The method according to claim 6, wherein, in the step of forming the first polyimide-based layer and the step of forming the second polyimide-based layer, each of the first and second polyimide-based layers is formed to a thickness of 1 μm to 10 μm.

11. The method according to claim 1, wherein, in the step of forming the oxide thin film transistor array, at least one an oxide thin film transistor is formed on the first polyimide-based layer.

12. A flexible display device, comprising:

a first polyimide-based layer formed of a polyimide-based material;

an oxide thin-film transistor array formed on the first polyimide-based layer;

a second polyimide-based layer formed of a polyimide-based material and formed on the oxide thin-film transistor array; and an organic light emitting diode formed on the second polyimide-based layer, wherein the first polyimide-based layer and the second polyimide-based layer have a same elastic modulus with each other, and wherein the oxide thin-film transistor array is disposed between the first polyimide-based layer and the second polyimide-based layer.

13. The flexible display device according to claim 12, wherein the polyimide-based materials constituting the first polyimide-based layer and the second polyimide-based layer are formed of a polyimide substance having a same composition.

14. The flexible display device according to claim 12, further comprising a buffer layer that is formed between the first polyimide-based layer and the oxide thin-film transistor array and comprises carbon nanotubes.

15. The flexible display device according to claim 12, wherein the second polyimide-based layer comprises a via contact penetrating the second polyimide-based layer to electrically connect the oxide thin-film transistor array to the organic light emitting diode.

16. The flexible display device according to claim 12, further comprising a touch sensor formed on the organic light emitting diode.

17. The flexible display device according to claim 12, wherein the first polyimide-based layer and the second polyimide-based layer are formed to a same thickness.

18. The flexible display device according to claim 12, wherein the first polyimide-based layer is formed to a thickness of 50% or less based on a thickness of the second polyimide-based layer.

19. The flexible display device according to claim 12, wherein the second polyimide-based layer is formed to a thickness of 50% or less based on a thickness of the first polyimide-based layer.

* * * * *